United States Patent
Doyle et al.

(10) Patent No.: US 7,307,896 B2
(45) Date of Patent: Dec. 11, 2007

(54) DETECTION OF ROW-TO-ROW SHORTS AND OTHER ROW DECODE DEFECTS IN MEMORY DEVICES

(75) Inventors: Daniel Doyle, Boise, ID (US); Michael Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 11/078,764

(22) Filed: Mar. 11, 2005

(65) Prior Publication Data
US 2006/0203599 A1    Sep. 14, 2006

(51) Int. Cl.
*G11C 5/14*    (2006.01)
(52) U.S. Cl. ............................ 365/189.09; 365/230.06; 365/189.11
(58) Field of Classification Search ........... 365/230.06, 365/226, 189.09, 189.11, 201, 203
See application file for complete search history.

(56) References Cited

U.S. PATENT DOCUMENTS

| | | | | |
|---|---|---|---|---|
| 5,633,832 | A * | 5/1997 | Patel et al. | 365/230.06 |
| 6,016,281 | A * | 1/2000 | Brox | 365/230.06 |
| 6,233,185 | B1 | 5/2001 | Beffa et al. | |
| 6,333,882 | B1 | 12/2001 | Merritt et al. | |
| 6,335,893 | B1 * | 1/2002 | Tanaka et al. | 365/226 |
| 6,349,054 | B1 * | 2/2002 | Hidaka | 365/173 |
| 6,356,492 | B1 | 3/2002 | Raad | |
| 6,795,361 | B2 | 9/2004 | Joo | |
| 7,009,885 | B2 * | 3/2006 | Pekny | 365/185.23 |
| 2001/0021128 | A1 * | 9/2001 | Kim | 365/185.23 |

OTHER PUBLICATIONS

Kaushik Roy, Fellow IEEE, Saibal Mukhopadhyay, Student Member, IEEE, and Hamid Mahmoodi-Meimand, Student Member, IEEE, Leakage Current Mechanisms and Leakage Reduction Techniques in Deep-Submicrometer CMOS Circuits, Proceedings of the IEEE, Feb. 2003, pp. 305-327, vol. 91, No. 2.
Micron Technology, Inc., 256 Mb: x4, x8, x16 DDR SDRAM, pp. 17-41, unknown date.

* cited by examiner

*Primary Examiner*—Gene N. Auduong
(74) *Attorney, Agent, or Firm*—Jones Day; Edward L. Pencoske

(57) ABSTRACT

A system and method to detect row-to-row shorts and other row decode defects in memory devices and other electronic devices having a similar data storage functionality is disclosed. A selective switching between a normal large pull-up device and a smaller one in a wordline driver path allows limiting the current in the pull-up circuit to a low value so as to detect shorts because the shorts will cause the active wordline voltage level to drop, while a wordline without shorts will operate well. A GIDL (Gate Induced Drain Leakage) reduction circuit may be used as a pull-up circuit connected to supply a bias voltage to the wordline driver associated with a wordline being tested for shorts or other defects. A test signal may be selectively generated during testing so as to supply a lower strength voltage output of the GIDL circuit (the VccpRDec output) as the bias voltage to the wordline driver. The test signal, when latched, may limit the Vccp current (by generating VccpRDec) to the row to be tested so as to detect row-to-row shorts without disturbing the VNWL (negative wordline voltage) and to reduce unnecessary stress and the P-channel breakdown in the row decodes during burn-in testing of a memory chip. Because of the rules governing abstracts, this abstract should not be used to construe the claims.

31 Claims, 3 Drawing Sheets

DETECTION OF ROW-TO-ROW SHORTS AND OTHER ROW DECODE DEFECTS IN MEMORY DEVICES

BACKGROUND

1. Field of the Disclosure

The present disclosure generally relates to electronic devices and, more particularly, to a system and method to detect row-to-row shorts and other row decode defects in semiconductor memory chips.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address select (RAS) signal, a column address select (CAS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in rows and columns to store data in rows and columns. A row decode circuit or row decoder 28 and a column decode circuit or column decoder 30 may select the rows and columns in the memory cells 26 in response to decoding an address provided on the address bus 17. Data to/from the memory cells 26 is then transferred over the data bus 18 via sense amplifiers and a data output path (not shown in FIG. 1, but shown in FIG. 2). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

A test mode control unit 34 is also illustrated as part of the memory chip 12. The test mode control unit 34 may include digital logic such as, for example, one or more test mode registers to perform testing of the memory chip 12 for example, during and after fabrication of the chip 12, as discussed later. A memory controller (not shown) may instruct the control unit 34 to generate and send appropriate test-related signals to the chip 12 during the test phase.

FIG. 2 is a simplified architecture for the memory device 12 shown in FIG. 1. It is evident that complex circuit details and constituent architectural blocks in the memory chip 12 are omitted from FIG. 2 for the sake of clarity and ease of illustration. As shown in FIG. 2, a data storage or memory array consists of a matrix of storage bits or memory cells 26, each bit being exclusively referenced by a corresponding row and column address (that may be present on the address bus 17). In the example of FIG. 2, the memory array consists of $2^m \times 2^n$ bits. Each row of memory cells may be called a "wordline" 36, whereas each column of memory cells may be called a "digitline" 35. In FIG. 2, there are $2^m$ rows addressable by the "m" row address lines input to the row decoder 38. Similarly, there are $2^n$ columns addressable by the "n" column address lines input to the column decoder 30. However, for ease of illustration, only one row (wordline 36) is shown in FIG. 2, and a few digitlines 35 are partially shown. Each memory cell or bit 26 may have a unique column address and row address associated with it as can be seen from the physical placement of memory cells 26 illustrated in FIG. 2. That is, each memory cell 26 may be connected to only one digitline 35 and only one wordline 36. A memory cell 26 may include a 1-transistor 1-capacitor (1T1C) design as is known in the art.

During a memory "activate" command, a row address is read in (from the address signals on the address bus 17 as is known in the art) and the row decoder 28 selects one of the $2^m$ rows or wordlines 36 depending on the combination of "m" bits present in the received row address. All $2^n$ cells 26 along this selected wordline 36 are activated and the data that is stored on each cell is routed to a sense amplifier 38 via digitlines 35. The sense amplifier 38 magnifies each bit of data that is stored to an appropriate voltage level (e.g., a "low" voltage level to represent a binary digit "0" and a "high" voltage level to represent a binary digit "1") at each activated cell 26. Next, the column decoder 30 selects one bit 26 out of the $2^n$ activated bits as is shown by the darkened bit 26 along a filly-drawn digitline 35 in FIG. 2. The bit chosen by the column decoder 30 is routed from the sense amplifier 38 out of the memory cell array to other amplification circuitry and output buffer 40 (which may be part of the I/O circuit 32), which sends the addressed data bit out to the data requestor (e.g., a microprocessor or a memory controller (not shown)) over appropriate data line 18. Similarly, other memory cells may be read for their data content.

A data write operation may be performed in a similar manner using appropriate data write circuitry (not shown) and, hence, is not described herein for the sake of brevity.

In modern memory designs, each wordline 36 may be connected to a negative wordline voltage (VNWL) (not shown in FIG. 2, but illustrated in FIG. 4) to reduce leakage current when the corresponding wordline is "off" or "inactive" as is known in the art. It is observed here that row-to-row (i.e., wordline-to-wordline) shorts have always existed on memory devices such as, for example, DRAM (Dynamic Random Access Memory) chips, upon fabrication. However, with the connection of wordlines to the negative wordline voltage (VNWL), it may be possible that shorted rows end up disturbing VNWL and, hence, increasing leakage current and associated power consumption. Therefore, it is desirable to devise a mechanism to detect wordline shorts in memory devices (or similar shorts in other electronic devices), while limiting the current supplied to the row decoder associated with the shorted wordlines. It is further desirable that the devised mechanism be useful in curing other row decode defects such as, for example, preventing overstress during burn-in testing of a memory device (or an electronic device) to remove infant failures.

SUMMARY

The present disclosure contemplates a method of biasing a wordline driver. The method comprises operating a pull-up circuit to selectively generate one of a high output level and a low output level, and applying the low output level as a bias voltage to the wordline driver.

In one embodiment, the present disclosure contemplates a method of operating a memory device. The method comprises operating a pull-up circuit with two output levels for a wordline driver, wherein a first circuit element in the pull-up circuit provides a high output level when activated and a second circuit element in the pull-up circuit provides a low output level when the first circuit element is deactivated; selectively deactivating the first circuit element, thereby selectively generating the low output level; and applying the low output level as a bias voltage to the wordline driver.

In another embodiment, the present disclosure contemplates a method of operating a memory device or an electronic device having a similar data storage functionality. The method comprises operating a pull-up circuit capable of producing a low supply strength output and a high supply strength output for a wordline driver, selectively generating the low supply strength output to limit the current in the pull-up circuit, and applying the low supply strength output to the wordline driver when a wordline associated with the wordline driver is active.

In a further embodiment, the present disclosure contemplates another method of operating a memory device. The method comprises operating a pull-up circuit capable of producing a low supply strength output and a high supply strength output for a wordline driver, selectively generating a test mode signal, and applying the test mode signal to the pull-up circuit so as to selectively provide the low supply strength output.

In a further embodiment, the present disclosure contemplates a memory device (or an electronic device with a similar data storage functionality) and a computer system incorporating such a memory device. The memory device comprises a plurality of memory cells connected in an array. A row driver is connected to a row of memory cells in the array. A pull-up circuit is connected to the row driver and is configured to generate one of a high output level and a low output level as a bias voltage therefor. A control unit coupled to the pull-up circuit and is configured to supply a test mode signal as an input thereto, wherein the pull-up circuit is configured to provide the low output level as the bias voltage to the row driver in response to the test mode signal input, and wherein the control unit is configured to selectively generate the test mode signal.

In another embodiment, the present disclosure contemplates a method of biasing a wordline driver. The method comprises operating a pull-up circuit capable of producing a low level of output and a high level of output to selectively generate the low level of output to limit the current in the pull-up circuit, and applying the low level of output as a bias voltage to the wordline driver.

In a further embodiment, the present disclosure contemplates a method of biasing a wordline driver. The method comprises operating a gate induced drain leakage (GIDL) reduction circuit to selectively generate a lower one of two output levels, and applying the lower output level as a bias voltage to the wordline driver.

In an alternative embodiment, the present disclosure contemplates another method of biasing a wordline driver. The method comprises operating a pull-up circuit capable of producing a low supply strength output and a high supply strength output to selectively generate the low supply strength output, and applying the low supply strength output as a bias voltage to the wordline driver.

In yet another embodiment, the present disclosure contemplates a method of biasing a wordline driver, wherein the method comprises operating a pull-up circuit to selectively generate one of a low voltage, low current drive output and a higher voltage, higher current drive output; and applying the low voltage, low current drive output as a bias voltage to the wordline driver.

In a further embodiment, the present disclosure contemplates a method of biasing a wordline driver. The method comprises providing a pull-up circuit capable of producing outputs of different current strengths, selectively generating a lower current strength output of the pull-up circuit, and applying the lower current strength output as a bias voltage to the wordline driver.

The detection of row-to-row shorts and other row decode defects in memory devices and other electronic devices having similar data storage functionality may be achieved by selective switching between a normal large pull-up device and a smaller pull-up circuit in a wordline driver path. That limits the current in the pull-up circuit to a low value so as to detect shorts because the shorts will cause the active wodline voltage level to drop, while a wordline without shorts will operate without such a voltage drop. A gate induced drain leakage (GIDL) reduction circuit may be used as a pull-up circuit connected to supply a bias voltage to the wordline driver associated with a wordline being tested for shorts or other defects. A test signal may be selectively generated during testing so as to supply a lower strength voltage output of the GIDL circuit (the VccpRDec output) as the bias voltage to the wordline driver. The test signal, when latched, may limit the Vccp current (by generating VccpRDec) to the row to be tested so as to detect row-to-row shorts without disturbing the VNWL (negative wordline voltage) and to reduce unnecessary stress and the P-channel breakdown in the transistors of row decoders during burn-in testing of a memory chip. In one embodiment, the test signal may also selectively isolate both supply strengths (of the GIDL circuit) from the wordline driver.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "coupled," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

Figure 3:
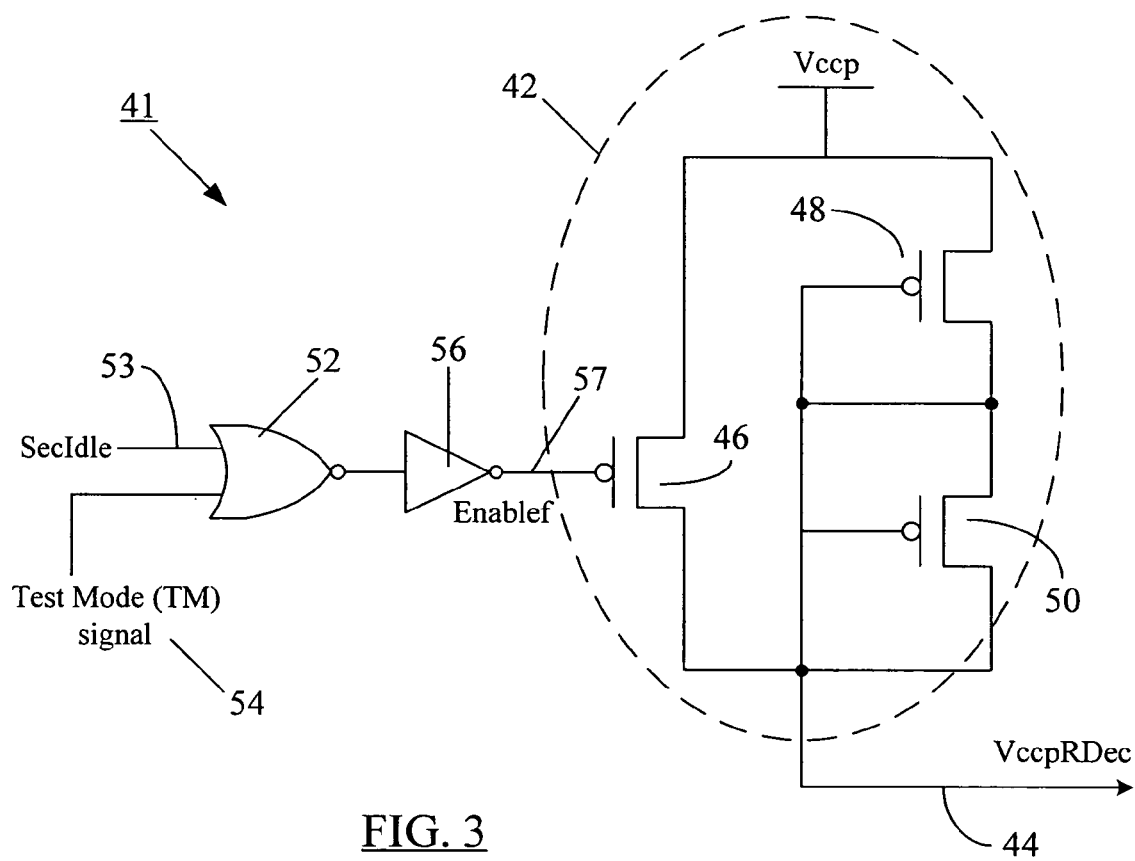
FIG. 3 illustrates an exemplary circuit configuration to limit the current supplied to a wordline driver during detection of wordline shorts.

FIG. 3 illustrates an exemplary circuit configuration 41 to limit the current supplied to a wordline driver (not shown in FIG. 3, but shown in FIG. 4) during detection of wordline shorts. A shorted row may corrupt data in adjacent or nearby rows. Therefore, it is desirable to detect and rectify wordline shorts. The reduction in current supplied to the wordline driver may be desirable to prevent the shorted rows from disturbing the VNWL level. It may be desirable to contain the leakage currents during shorts so as to protect VNWL from being pulled positive towards the bias voltage Vccp. In the embodiment of FIG. 3, a GIDL (Gate Induced Drain Leakage) reduction circuit 42 is used in conjunction with a two-input NOR gate 52 and an inverter 56 to generate a bias voltage VccpRDec (VccpRowDecode) (on output line 44) that may be supplied to a wordline driver (e.g., the driver 62 in FIG. 4) in a row decoder. As is known in the art, the gate induced drain leakage occurs due to high field effect in the drain junction of an MOS (Metal Oxide Semiconductor) transistor. Various GIDL reduction circuits are known in the art. The circuit 42 in FIG. 3 is one such GIDL reduction circuit. Previous to the use of surface P-channel devices, there was a need for the GIDL circuit 42 to stop or limit the current (i.e., gate induced drain leakage) through the wordline drivers in a row decoder. In a surface P-channel memory device (e.g., the memory device 72 in FIGS. 5-6), such GIDL circuit, although not necessary, may still be used to limit the current to the wordline driver as discussed below.

The GIDL reduction circuit 42 may provide two output signal strengths or output levels at output line 44. When a large pull-up device 46 in the circuit 42 is active, the output at line 44 may be at the full Vccp level provided by a Vccp power bus (not shown) in the memory architecture. However, when the large P-channel device 46 is disabled, the smaller pull-up devices 48 and 50 operate to provide an output bias voltage VccpRDec which is less than Vccp. Furthermore, there is a higher current drive through the GIDL circuit 42 when the higher voltage (Vccp) is output and a low current drive when the lower voltage (VccpRDec) is output. The VccpRDec signal may be supplied to a wordline driver circuit via another system power bus (e.g., a VccpRDec power bus (not shown)). The switching from the large pull-up device 46 to the smaller one (i.e., the transistors 48 and 50) also results in limiting the current in the pull-up circuit (of transistors 48 and 50) and, hence, in the output bias voltage VccpRDec. The selective switching between a normal large pull-up device (transistor 46) and a smaller one (i.e., the combination of transistors 48 and 50) in the wordline driver path may be accomplished using an exemplary circuit configuration comprising of the NOR gate 52 and the inverter 56 and a selectively-generated test mode (TM) signal 54. It is noted that the term "selective," such as in "selective switching," may refer to a switching action that is user-controlled as opposed to a default circuit operation that may not be altered whenever desired. Thus, in the embodiment of FIG. 3, whenever it is desired to deactivate the large P-channel device 46 in the GIDL reduction circuit 42 and, hence, to generate the VccpRDec signal as output 44, the TM signal 54 may be asserted "high" (or at logic "1" level) so as to raise the Enablef signal 57 (which may be generally active "low") at the gate of the device 46 to a logic high state to disable the large P-channel transistor 46. Alternatively, when the generation of VccpRDec is not desired for current limiting application, the TM signal 54 may be asserted "low" (or at logic "0" level) so as to allow the control of the activation of the device 46 by the SecIdle signal 53, which may then activate or deactivate the transistor 46 depending on various circuit design considerations. For example, in one embodiment, the SecIdle input 53 may be used (asserted "high") to disable a large group or "section" of rows when no row in a memory section (not shown) is to be active. This enables the GIDL reduction aspect of this circuit. The application of the SecIdle signal 53 may be automatic and the SecIdle signal 53 may never be asserted "high" when a row in the corresponding memory section (not shown) is to be accessed.

In one embodiment, the TM signal 54 may be generated by a test mode control unit (e.g., the control unit 74 in FIG. 5) under instructions from a memory controller unit (e.g., the memory controller 80 in FIG. 5) connected to a memory chip containing the circuit configuration 41 in FIG. 3. A circuit designer may program the memory controller to generate and supply a test mode Latch command to the test mode control unit, which, in turn, may internally generate the TM signal 54 (and latch it "high") in response to the command. A test mode Clear command may be sent from the memory controller to bring the asserted TM signal 54 to the logic "low" state, thereby disabling the TM signal 54. Thus, the generation of the TM signal 54 may be synchronously controlled by test mode Latch and Clear commands. In one embodiment, an externally-supplied test mode command can be received at a memory pin (not shown) (which may be dedicated to receive testing related commands) to asynchronously generate the TM signal state using, for example, the test mode control unit (e.g., the control unit 74 in FIG. 5). The TM signal 54 may be manually triggered (by a circuit designer) using the memory controller when desired during testing of a memory chip. Other circuit arrangements to automatically or manually activate the TM signal 54 may be devised as is known in the art.

In an alternative embodiment, the circuit configuration 41 in FIG. 3 may be used in memory devices that do not employ surface P-channel transistors. In that embodiment, a memory device may already contain the GIDL reduction circuit 42 as discussed before. However, a selective activation or deactivation of the large P-channel device 46 may be accomplished in such a memory device by feeding an internal GIDL control signal (not shown) to the additional logic gates 52 and 56 which may be provided to generate the VccpRDec signal under user control. Thus, the existing GIDL reduction circuit configuration may be modified to provide it with the Enablef input 57 generated in the manner illustrated in FIG. 3 so as to enable a circuit designer to selectively generate the VccpRDec signal during testing of wordline shorts. In one embodiment, the GIDL control signal (not shown) may be configured to be active (logic "1") after sufficient delay for a memory row to be fully charged to Vccp. In one embodiment, this delay may equal to the time duration between an activation of a wordline (for, e.g., a data read operation) and a commencement of a data read operation involving that wordline. During this time period, it may be desirable to apply the full Vccp level to the wordline instead of the reduced signal level (VccpRDec).

Figure 4:
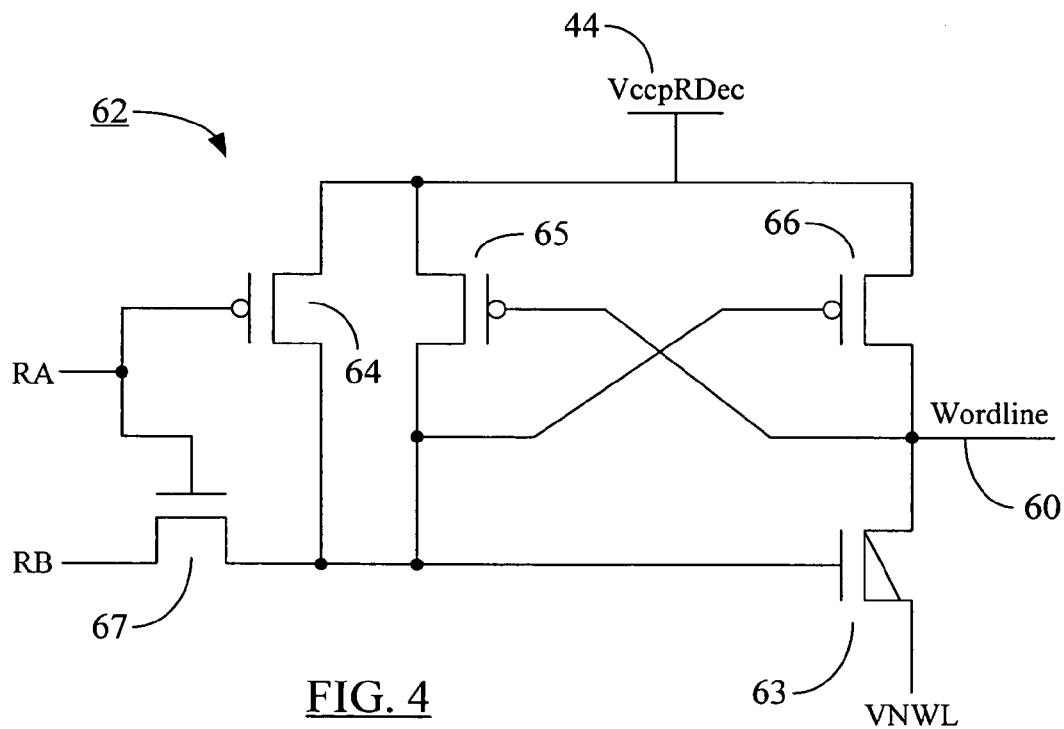
FIG. 4 shows an exemplary wordline driver circuit with a bias voltage supplied by the GIDL reduction circuit shown in FIG. 3.

FIG. 4 shows an exemplary wordline driver circuit 62 with a bias voltage 44 supplied by the GIDL reduction circuit 42 shown in FIG. 3. The driver circuit 62 may include the transistor pair 65-66, the VNWL supply transistor 63, and additional transistors 64 and 67. The input to this circuit 62 is denoted as "RA" which is to be high to turn a row on and low to turn the row off. The other input "RB" is active low and, hence, if input RA is high, the transistor 64 is off whereas transistor 67 is on. The "on" transistor 67 passes a "low" output to transistors 63 and 66, thereby turning the wordline (WL) output 60 on. On the other hand, if input RA is low, then the transistor 64 is on, thereby pulling the gates of transistors 63 and 66 high and, thus, turning the WL output 60 off. The driver circuit 62 may be used, for example, to read data from a wordline 60. The bias voltage VccpRDec 44 may be selectively generated under the control of the TM signal 54 as discussed before. Although only VccpRDec is shown to be applied to the driver circuit 62 in FIG. 4, it is evident to one skilled in the art that the regular bias voltage Vccp remains applied (via the system power bus, or the Vccp bus (not shown)) to the driver 62 when VccpRDec signal is not present on the VccpRDec bus (not shown). Thus, either of the signals—Vccp or VccpRDec—may be selectively applied as a bias to the driver circuit 62 using, for example, appropriate signal transfer circuit or logic that can be devised by one skilled in the art.

The deactivation of the large P-channel device 46 limits the current supplied to the wordline driver 62 in a row decoder (not shown) while the sense amplifiers (not shown) are enabled, i.e., when a corresponding row (or wordline 60) is active. As noted before, the TM signal 54 may be used to disable the large P-channel device 46 that connects Vccp to VccpRDec. When TM signal 54 is active (logic "1"), the application of VccpRDec to the bias line of the wordline driver 62 may prevent the VNWL line (shown in FIG. 4 as a terminal of the transistor 63) from being pulled positive till repairs to a shorted row are made. It is noted that the TM signal 54 may be enabled while writing and reading sense amplifiers (in case of an active wordline, e.g., the wordline 60). It is noted here that the TM signal 54 may be enabled at any time (regardless of memory read or write operations) after allowing the selected wordline to reach a full Vccp voltage level. The TM signal 54 may be disabled during the wordline or row ACTIVE command (i.e., when a wordline is turned on or activated, e.g., prior to a data read operation) or before a wordline PRECHARGE command (i.e., when a wordline is turned off, e.g., prior to a data write operation). In both of these situations, it may be desirable to pre-establish a full Vccp level on the wordline for subsequent sensing and restoring of data.

A wordline short can be detected if the main Vccp supply to the wordline (e.g., the wordline 60) is cut off and only a small transistor or diode configuration (e.g., the combination of transistors 48 and 50 in FIG. 3) is employed to keep the wordline 60 at or close to Vccp (via the VccpRDec signal) while a memory sub-array (not shown) containing the wordline 60 is active (e.g., for a data read operation). The current on the VccpRDec bus (not shown) connected to the wordline driver 62 may be reduced when the VccpRDec signal is supplied to the wordline driver 62 via the VccpRDec bus (not shown) upon activation of the TM signal 54. In the absence of large row shorts consuming VccpRDec current, the activated row 60 will maintain its prior-established Vccp level. However, in the event of a short, the earlier-present Vccp level on the wordline 60 will decrease until, eventually, the data in the cell (on the wordline 60) (not shown) cannot be read/written. This decrease in voltage level and the resulting inability to read/write data into a cell on the wordline 60 can be easily detected. For example, the decay in the wordline voltage may first show up by failing to write a "1" to the cells on the shorted wordline. A subsequent reading of these 1's may detect that the earlier write operation failed. Thus, a standard memory read/write operation may suffice to alert to the wordline short condition.

Thus, the operation of the GIDL reduction circuit 42 may be modified (when the TM signal 54 is latched) to limit the Vccp current to a row (e.g., the wordline 60) that is to be tested for a short. In the absence of large row shorts consuming VccpRDec current, the activated row (e.g., the row 60) will maintain its Vccp level. However, with a short, that row voltage will decline along with the VccpRDec voltage, and the VNWL voltage will be protected from being pulled positive. Further, the VccpRDec current leak provides for more effective detection of the defective row. Thus, the ability to switch between a normal large pull-up device (e.g., the transistor 46 in FIG. 3) and a smaller one (e.g., the transistor pair 48 and 50) in the wordline driver path using the TM signal 54 allows current limiting in the pull-up circuit (e.g., the GIDL circuit 42 in FIG. 3) to a low value such that operating a wordline with a short will cause the wordline voltage to drop, while a wordline without shorts will operate well in maintaining the proper wordline voltage. In one embodiment, the test signal 54 may also selectively isolate both supply strengths (Vccp and VccpRDec) from the wordline driver 62. In that embodiment, a P-channel device (not shown) gated by the TM signal 54 may be placed in series with the device 50 and the output line 44 (FIG. 3). The P-channel device (not shown) may always be "ON" when the TM signal 54 is disabled and "OFF" when the TM signal 54 is enabled. The "OFF" state of the P-channel device (not shown) may result in turning off supply of both the strong and weak voltage levels (of the GIDL circuit 42) to the wordline driver 62 (FIG. 4).

The procedure discussed hereinbefore to detect wordline shorts may be used during testing or "wafer probe" phase in the manufacture of semiconductor memory chips. Once the shorts are detected, the bad wordlines may be disabled and replaced with an "extra" or redundant wordline as is known in the art. This is called a "repair", and is done preferably prior to putting the die (containing the circuit for a memory device) into a package.

In practice, the GIDL reduction circuit 42 may be used to supply current to a large number (typically 512) of wordline drivers in a section of a memory array. However, if the default GIDL device 42 does not supply enough current and voltage, an additional small P-channel device (not shown) having a few percentage of the nominal row driver pull-up strength can be included in the GIDL circuit 42 to provide a short between Vccp and VccpRDec to supply a measured and small amount of current when the TM signal 54 is latched. Such additional P-channel device may be gated by a signal (not shown) that can be generated off of the GIDL control signal (not shown) discussed hereinbefore. The gate length and width of the P-channel device may determine its current drive strength. In one embodiment, the current limiting may be accomplished by shutting down the default current supply from the GIDL circuit 42, if necessary, by having a small P-channel device (not shown) in parallel with the GIDL diodes 48, 50 and gated by a signal (not shown) that can be generated off of the GIDL control signal (not shown) discussed hereinbefore. Similar other configurations to limit Vccp current from the GIDL circuit 42 may be devised by one skilled in the art based on the teachings in the present disclosure. Each of the GIDL diodes 48, 50 may be a single NMOS diode-connected transistor, or a real diode, etc.

In one embodiment, the TM signal 54 may be used to provide more sensitive detection of row shorts by running the following exemplary sequence of a test program on each row to be tested for a short. Each step in the sequence below may be performed on a separate clock cycle of the clock (not shown) that is used to synchronize data read/writes from the wordline to be tested (e.g., the wordline 60 in FIG. 4). For example, each step may be executed on a separate rising edge of the clock (not shown). In one embodiment, the clock cycle may be of 30 ns duration.

(1) Disable the TM signal 54
(2) Issue the Row Active command (which turns on the wordline to be tested)
(3) Latch the TM signal 54 (to a logic "1" level)
(4) No Operation (NOP command)
(5) No Operation (NOP command)
(6) No Operation (NOP command)
(7) Write 1's in the cells on the wordline
(8) Disable the TM signal 54 after the Row Precharge command is issued (which will turn off or deactivate the wordline to be tested)

It is observed that if the wordline 60 is shorted then, during the foregoing sequence of operations, the voltage on the shorted row 60 will decay enough to prevent writing of sufficient 1's voltage levels to the cells in the wordline 60. This defect can be detected by reading the data written in the wordline cells. In one embodiment, only one column on each row to be tested would need to be read to ascertain that a short has prevented the writing of the sequence of 1's in the row.

In an alternative embodiment, the circuit configuration 41 in FIG. 3 may be used to address other row decode defects in DRAM devices. For example, the TM signal 54 may be used in the configuration 41 shown in FIG. 3 to reduce overstress of a given memory section during a testing phase when an accelerated stress (which may also be referred to as the "BURN" or "burn-in" stress) is applied to a memory part (e.g., the memory device 72 in FIG. 5) to remove infant failures. This testing may be performed after the die containing the memory chip to be tested for infant failures is assembled into a package. The activation of the TM signal 54 during this test phase may reduce the P-channel breakdowns in the transistors (e.g., the transistors 64-66 in FIG. 4) in a wordline driver (e.g., the driver 62) in a row decoder. The breakdowns may occur during the BURN stress exerted on the driver transistors, resulting in P-channel degradation during infant stress. The TM signal 54 and the circuit configuration in FIG. 3 may be used to reduce unnecessary stress and P-channel degradation as discussed below.

During periods of high Vccp stress, predominantly during the burn-in test phase, the VccpRDec associated with an inactive row (e.g., the row 60 in FIG. 4) may reduce to (Vccp-Vt), where Vt is the threshold voltage of transistor 66, which is under the highest stress because its output is at VNWL when the transistor 66 is off. The reduction in VccpRDec may reduce the stress on the access transistors (not shown) on the WL 60 as well as on the transistor 63 when the row 60 is on (and, therefore, the transistor 63 is off). The reduction in VccpRDec may seem small, but in terms of percentages, the voltage drop across the P-channel device 66 empowering the wordline 60 may drop by as much as 10%-15%. In FIG. 4, the voltage drop across the P-channels in device 66, from VccpRDec 44 to the wordline 60 in the row decode, can exceed 4V when the wordline 60 is inactive. Forcing the diode drop across the devices 48 and 50 in FIG. 3 by driving the Enablef signal 57 "high" (by activating the TM signal 54 to the logic "1" state) may reduce the row decode P-channel stress in the device 66 (FIG. 4) during times when the wordlines (e.g., the wordline 60) associated with the particular row decode (not shown) are inactive. It is observed that because VccpRDec is a "section" signal applied to a large group of wordlines, reducing the VccpRDec (as discussed herein) on an active wordline may also drop/reduce the voltage across a large number of inactive wordline pull-up devices 66 in the same memory "section" (not shown). Because these devices 66 have one side VccpRDec potential and another side at VNWL potential (where VNWL is more negative than the circuit "ground" potential), the effect of the voltage drop across the devices 66 may be significant as mentioned hereinabove.

In one embodiment, upon completing the stress of a given section of memory array (not shown), the BURN infant stress pattern may fire a row (e.g., the row 60 in FIG. 4) a few times with the TM signal 54 latched so as to quickly discharge the VccpRDec power bus (not shown) to the desired level as discussed below in an exemplary set of test steps. As a result, it may not be necessary to include and maintain any extra Vccp pull-down devices in the circuit configurations of FIGS. 3 and 4. The following exemplary test pattern may be executed to avoid overstress at burn-in without needing to maintain an extra passive device (not shown) to pull Vccp down after a memory sub-array is pre-charged. In one embodiment, the VccpRDec signal can be actively pulled down as follows:

(1) Clear (or deactivate) the TM signal 54.
(2) Activate (or turn on) Row X (e.g., row 60 in FIG. 4) in a group of rows.
(3) Write at least one column (e.g., with a "1") in the activated Row X.
(4) Precharge (or turn off) Row X.

(5) Repeat steps 2-4. This repetition can be a single loop involving one additional row or multiple loops involving all the rows in a given memory sub-array.
(6) Latch (or activate) the TM signal 54.
(7) Activate (or turn on) Row X using any row address in the same sub-array that was just stressed. Thus, here, any one of the rows X may be turned on.
(8) Precharge (or turn off) Row X.
(9) Repeat steps 7-8 until VccpRDec 44 is reduced to the required amount. It may require a single loop of steps 7-8 to lower the VccpRDec to the desired level.
(10) Jump back to step (1) and increment row addresses to stress a new group of rows.

In an alternative embodiment, test coverage for stuck on rows (SOR), where the output of a given row driver is shorted to the input of its neighboring row driver, may be improved using the teachings of the present disclosure. The SOR condition may not normally consume additional current when either of the affected rows are fired. However, if both of the affected row drivers (not shown) are activated at the same time using a test mode command (e.g., a Sticky_Row command to turn multiple rows on at once during a Sticky test mode), it may create a short circuit path (through the common node (not shown) in the row predecode tree (not shown) in a row decoder) so that the output of the defective wordline driver is shorted to its own input. This condition may draw enough VccpRDec current to be easily detected with the TM signal 54 latched. Thus, the circuit 41 may be used in the Sticky test mode to detect SOR defects. It is noted here that when both of the affected rows are concurrently selected by the predecode tree (not shown) (when devices 67 are on for both rows because the RB node (FIG. 4) is common to each device 67 in the affected row driver), neither row may successfully fire due to the current path that is created between the inputs of the two affected row drivers (not shown). Although the Sticky_Row command allows each selected row with an individual ACTIVE command, the same result may be obtained with an automatic mode that fires both rows with a single row activation command. It is observed here with reference to FIG. 4 that each row may have a unique RA node, but adjacent rows may share the same RB node.

It is noted that although one row driver 62, one wordline 60, and one GIDL circuit 42 are shown and discussed with reference to FIGS. 3 and 4, it is evident to one skilled in the art that the circuit configurations 41 and 62 in FIGS. 3 and 4 are exemplary only. In a commercial embodiment, there may be many such wordlines, wordline drivers and GIDL circuits selectively controlled by a corresponding set of test mode signals as per the teachings of the present disclosure. In other words, the circuit configurations in FIGS. 3 and 4 may be replicated as many times as desired in a commercial memory device as is evident to one skilled in the art.

Figure 1:
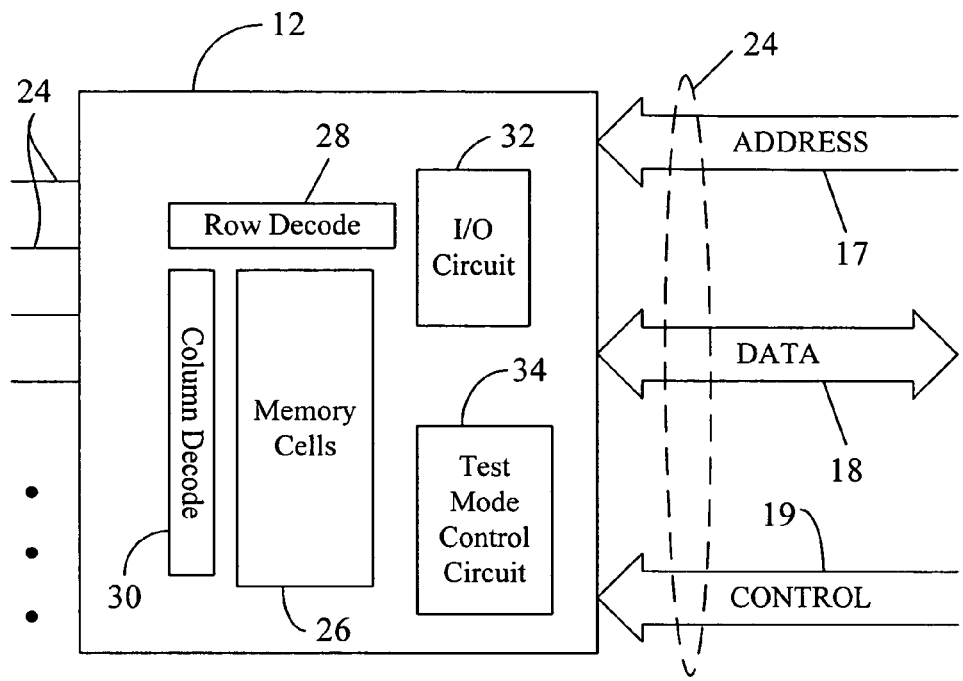
FIG. 1 is a simplified block diagram showing a memory chip or memory device.
Figure 2:
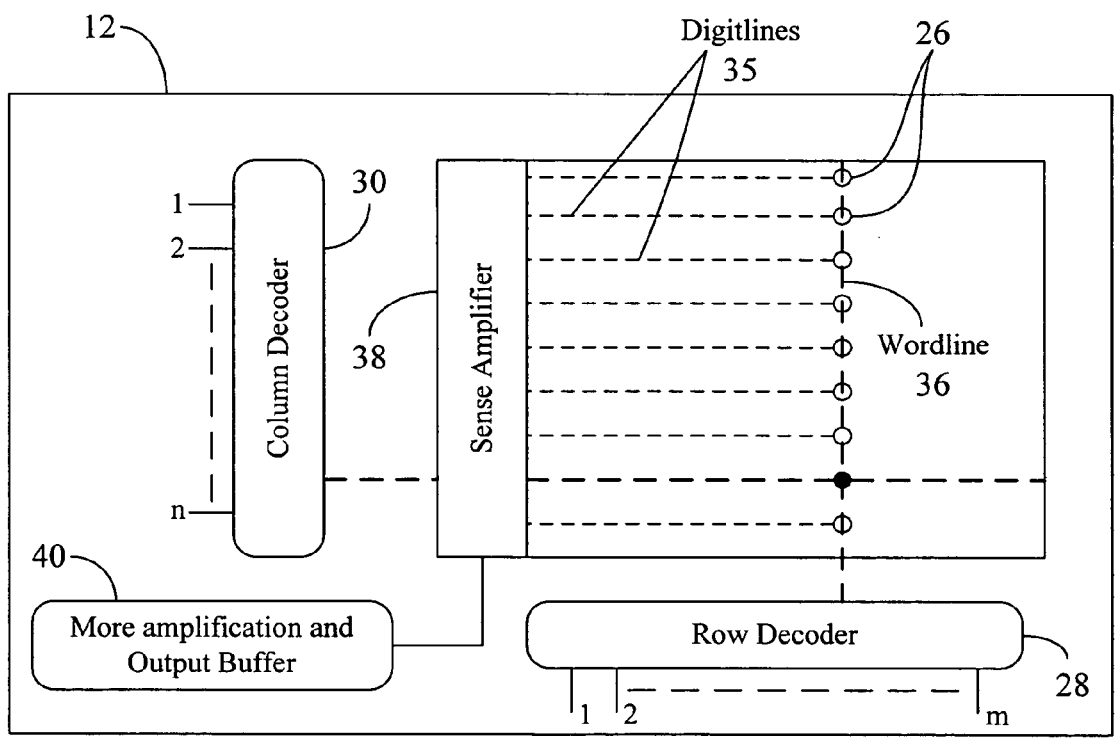
FIG. 2 is a simplified architecture for the memory device shown in FIG. 1.
Figure 5:
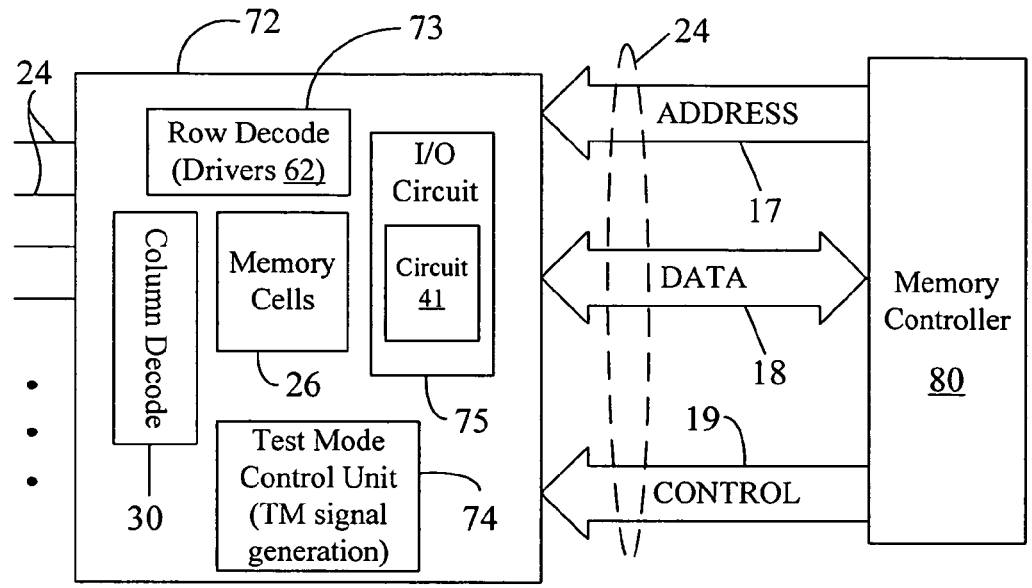
FIG. 5 is a simplified block diagram showing a memory chip that employs the circuit configurations illustrated by way of examples in FIGS. 3-4.

FIG. 5 is a simplified block diagram showing a memory chip 72 that employs the circuit configurations illustrated by way of an example in FIGS. 3-4. For example, the circuit configuration 41 in FIG. 3 may be part of an I/O circuit 75 in chip 72. The memory chip 72 may also contain a row decoder 73 where one or more wordline drivers have the circuit configuration 62 illustrated in FIG. 4. The test mode control unit 74 in the memory chip 72 may differ from the unit 34 in that the control unit 74 is configured to provide the test mode signal 54 and may also contain a detection circuit (not shown) to detect voltage drops on VccpRDec due to wordline shorts as discussed hereinbefore. The memory chip 72 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 72 is a DDR DRAM operating at a clock frequency of 667 MHz and an I/O data rate of 1334 MHz. It is noted here that although other elements in the memory chip 72 are designated with the same reference numerals as those given in FIG. 1, it may be possible that those components having same reference numerals may not be identical in the memories 12 and 72. For example, the architecture of the memory cells 26 and the column decoder 30 in the memory chip 72 may be different from that in chip 12 to take into account the new wordline driver and current limiting circuit configurations illustrated in FIGS. 3-4. However, for the sake of simplicity, units with similar functionality are denoted by same reference numerals in FIGS. 1 and 5.

In FIG. 5, the memory chip 72 is shown connected to a memory controller 80. The memory controller 80 can be a microprocessor, digital signal processor, embedded processor, micro-controller, dedicated memory test chip, a tester platform, or the like. The memory controller 80 may control routine data transfer operations to/from the memory 72, for example, when the memory device 72 is part of an operational computing system (e.g., the system 84 discussed below with reference to FIG. 6). The memory controller 80 may reside on the same motherboard (not shown) as that carrying the memory chip 72. Various other configurations of electrical connection between the memory chip 72 and the memory controller 80 may be possible. For example, the memory controller 80 may be a remote entity communicating with the memory chip 72 via a data transfer or communications network (e.g., a LAN (local area network) of computing devices).

Figure 6:
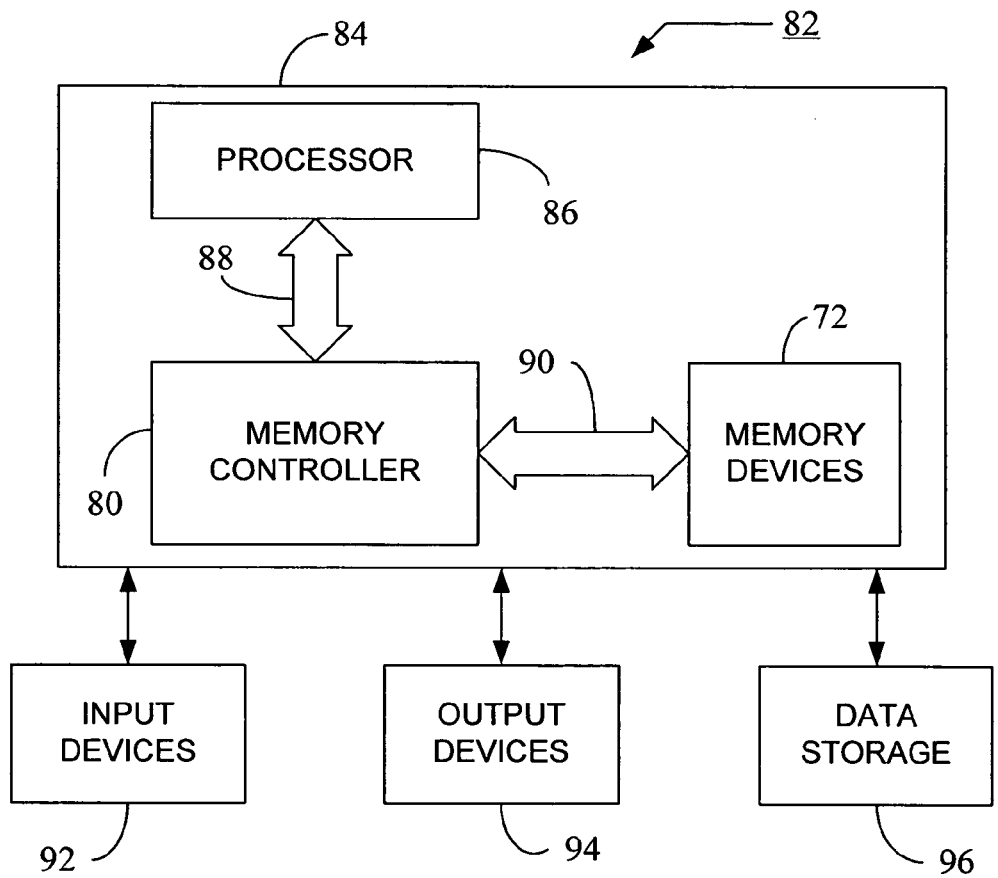
FIG. 6 is a block diagram depicting a system in which one or more memory chips illustrated in FIG. 5 may be used.

FIG. 6 is a block diagram depicting a system 82 in which one or more memory chips 72 illustrated in FIG. 5 may be used. The system 82 may include a data processing unit or computing unit 84 that includes a processor 86 for performing various computing functions, such as executing specific software to perform specific calculations or data processing tasks. The computing unit 84 also includes the memory controller 80 that is in communication with the processor 86 through a bus 88. The bus 88 may include an address bus (not shown), a data bus (not shown), and a control bus (not shown). The memory controller 80 is also in communication with a set of memory devices 72 (i.e., multiple memory chips 72 of the type shown in FIG. 5) through another bus 90, which may also include relevant address, data, and control lines similar in configuration to that shown for the bus 24 in FIG. 5. In one embodiment, each memory device 72 is a DDR3 DRAM operating at a clock frequency of 667 MHz and a data I/O rate of 1334 MHz. Each memory device 72 may include appropriate data storage and retrieval circuitry (not shown in FIG. 6) as shown in FIG. 5. The processor 86 can perform a plurality of functions based on information and data stored in the memories 72.

The system 82 may include one or more input devices 92 (e.g., a keyboard or a mouse) connected to the computing unit 84 to allow a user to manually input data, instructions, etc., to operate the computing unit 84. One or more output devices 94 connected to the computing unit 84 may also be provided as part of the system 82 to display or otherwise output data generated by the processor 86. Examples of output devices 94 include printers, video terminals or video display units (VDUs). In one embodiment, the system 82 also includes one or more data storage devices 96 connected to the data processing unit 84 to allow the processor 86 to store data in or retrieve data from internal or external storage media (not shown). Examples of typical data storage devices 96 include drives that accept hard and floppy disks, CD-ROMs (compact disk read-only memories), and tape cassettes. As noted before, the memory devices 72 in the computing unit 84 have the configuration illustrated in FIG. 5, i.e., each memory device 72 includes the circuit configurations illustrated in FIGS. 3 and 4.

It is observed that although the discussion given hereinbefore has been primarily with reference to memory devices, it is evident that the signal driver configuration illustrated in FIGS. 3-4 may be employed, with suitable modifications which will be evident to one skilled in the art, in any non-memory electronic device that may utilize a signal driver circuit for signal lines (similar to the wordline 60 in FIG. 4) that carry data or other bits of information for reading or writing into corresponding information storage units (similar in function to the memory cells 26 discussed hereinbefore) in the electronic device.

The foregoing describes a system and method to detect row-to-row shorts and other row decode defects in memory devices and other electronic devices having a similar data storage functionality. A selective switching between a normal large pull-up device and a smaller one in a wordline driver path allows limiting the current in the pull-up circuit to a low value so as to detect shorts because the shorts will cause the wordline voltage to drop, while a wordline without shorts will operate well. A GIDL (Gate Induced Drain Leakage) reduction circuit may be used as a pull-up circuit connected to supply a bias voltage to the wordline driver associated with a wordline being tested for shorts or other defects. A test signal may be selectively generated during testing so as to supply a lower strength voltage output of the GIDL circuit as the bias voltage to the wordline driver. The test signal, when latched, may limit the Vccp current to the row to be tested so as to detect row-to-row shorts without disturbing the VNWL (negative wordline voltage) and to reduce unnecessary stress and the P-channel breakdown in the transistors in the row decoders during burn-in testing of a memory chip.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of biasing a wordline driver, comprising:
    operating a pull-up circuit to selectively connect an output bus to a predetermined voltage through one of a high strength current path and a low strength current path to generate one of a high output level and a low output level, respectively;
    selectively applying one of said high output level or said low output level as a bias voltage to said wordline driver; and
    outputting said low output level from said wordline driver when a wordline associated with said wordline driver is active.

2. The method of claim 1, wherein said applying includes: applying said bias voltage to said wordline driver during a data read/write operation involving a wordline associated with said wordline driver.

3. The method of claim 1, wherein said operating includes: selectively generating said low output level during a data read/write operation involving a wordline associated with said wordline driver.

4. The method of claim 1, wherein said operating includes: selectively generating said low output level when a wordline associated with said wordline driver is active.

5. The method of claim 1, wherein said operating includes at least one of the following: selectively generating said low output level during a burn-in test of a wordline associated with said wordline driver; and selectively generating said low output level during detection of whether a wordline associated with said wordline driver has an electrical short.

6. The method of claim 1, further comprising: selectively generating said high output level of said pull-up circuit; and applying said high output level as said bias voltage to said wordline driver in an absence of generation of said low output level.

7. A method of operating a memory device, comprising:
    operating a pull-up circuit with two output levels for a wordline driver, wherein a first circuit element in said pull-up circuit selectively connects an output bus to a predetermined voltage to provide a high current drive output level when activated and a second circuit element in said pull-up circuit selectively connects said output bus to said predetermined voltage to provide a low current drive output level when said first circuit element is deactivated;
    selectively deactivating said first circuit element, thereby selectively generating said low output level;
    applying said low output level as a bias voltage to said wordline driver;
    outputting said low output level from said wordline driver when a wordline associated with said wordline driver is active; and
    detecting a drop in the wordline voltage from said predetermined voltage.

8. The method of claim 7, wherein said selectively deactivating includes: deactivating said first circuit element during a data read/write operation involving a wordline associated with said wordline driver.

9. The method of claim 7, wherein said selectively deactivating includes at least one of the following: deactivating said first circuit element during a burn-in test of a wordline associated with said wordline driver; and deactivating said first circuit element during detection of whether a wordline associated with said wordline driver has an electrical short.

10. The method of claim 7, wherein said selectively deactivating includes: selectively generating a test mode signal; and applying said test mode signal to a logic circuit coupled to said pull-up circuit, wherein said logic circuit is configured to deactivate said first circuit element when said test mode signal is applied thereto.

11. A method of operating a memory device, comprising:
    operating a pull-up circuit to selectively connect an output bus to a predetermined voltage through one of a low strength current path and a high strength current path for producing a low supply strength output and a high supply strength output, respectively, for a wordline driver;
    selectively generating said low supply strength output to limit the current in said pull-up circuit;

applying said low supply strength output to said wordline driver when a wordline associated with said wordline driver is active; and detecting a drop in a wordline voltage from said predetermined voltage.

12. The method of claim 11, wherein said applying includes: applying said low supply strength output as a bias voltage to said wordline driver.

13. A method of operating a memory device, comprising:

operating a pull-up circuit to selectively connect an output bus to a predetermined voltage through one of a low strength current path and a high strength current path for producing a low supply strength output and a high supply strength output, respectively, for a wordline driver;

selectively generating a test mode signal;

applying said test mode signal to said pull-up circuit so as to selectively provide said low supply strength output; and detecting a drop in a wordline voltage from said predetermined voltage.

14. The method of claim 13, wherein said selectively generating includes at least one of the following: generating said test mode signal during a burn-in test of a wordline associated with said wordline driver; and generating said test mode signal during detection of whether a wordline associated with said wordline driver has an electrical short.

15. The method of claim 13, wherein said operating includes: activating a circuit element in said pull-up circuit to provide said high supply strength output, and deactivating said circuit element in said pull-up circuit to provide said low supply strength output; and wherein said applying includes: applying said test mode signal to deactivate said circuit element.

16. A method of operating an electronic device, comprising:

operating a pull-up circuit to selectively connect an output bus to a predetermined voltage through one of a low strength current path and a high strength current path for producing a low supply strength output and a high supply strength output, respectively, for a data line driver in said electronic device;

selectively generating said low supply strength output of said pull-up circuit;

applying said low supply strength output as a bias voltage to said data line driver when a data line associated with said data line driver is active; and detecting a drop in the data line voltage from said predetermined voltage.

17. The method of claim 16, wherein said operating includes: activating a circuit element in said pull-up circuit to provide said high supply strength output; and deactivating said circuit element in said pull-up circuit to provide said low supply strength output.

18. The method of claim 17, wherein said selectively generating includes selectively deactivating said circuit element.

19. A memory device, comprising:

a plurality of memory cells connected in an array;

a row driver connected to a row of memory cells in the array;

a pull-up circuit connected to said row driver and configured to selectively connect said row driver to a predetermined voltage through one of a high strength current path and a low strength current path for generating one of a high output level and a low output level, respectively, as a bias voltage therefor, wherein said row driver is configured to output one of said high output level and said low output level when said row of memory cells connected to said row driver is active;

a control unit coupled to said pull-up circuit and configured to supply a test mode signal as an input thereto, wherein said pull-up circuit is configured to provide said low output level as said bias voltage to said row driver in response to said test mode signal input, and wherein said control unit is configured to selectively generate said test mode signal; and a detection circuit responsive to a voltage level of an active row.

20. The device of claim 19, wherein said control unit is configured to selectively generate said test mode signal when said row of memory cells is active.

21. The device of claim 19, wherein said control unit is configured to selectively generate said test mode signal during a data read/write operation involving said row of memory cells.

22. The device of claim 19, wherein said control unit is configured to selectively generate said test mode signal during at least one of the following: a burn-in test of the memory cells in said row of memory cells; and a detection of whether said row of memory cells has an electrical short.

23. The device of claim 19, wherein said pull-up circuit includes: a first circuit element configured to provide said high output level when activated; and a second circuit element connected to said first circuit element and configured to provide said low output level when said first circuit element is deactivated, and wherein said test mode signal is configured to deactivate said first circuit element.

24. An electronic device, comprising:

a plurality of storage locations to store data;

a data line driver connected to a data line containing said plurality of storage locations;

a pull-up circuit connected to said data line driver and configured to selectively connect said data line driver to a predetermined voltage through one of a low strength current path and a high strength current path for generating one of a low level of output and a high level, respectively, of output as a bias voltage therefor, wherein said data line driver is configured to output one of said high output level and said low output level when said data line connected to said data line driver is active;

a control unit coupled to said pull-up circuit and configured to supply a test mode signal as an input thereto, wherein said pull-up circuit is configured to provide said low level of output as said bias voltage to said data line driver in response to said test mode signal input, and wherein said control unit is configured to selectively generate said test mode signal; and a detection circuit responsive to a voltage level of an active data line.

25. A system, comprising:

a processor;

a bus; and a memory device coupled to said processor via said bus, wherein said memory device includes:

a plurality of memory cells to store data;

a row driver connected to a memory row containing said plurality of memory cells;

a pull-up circuit connected to said row driver and configured to selectively connect said row driver to a predetermined voltage through one of a high strength current path and a low strength current path to generate one of a high output level and a low output level, respectively, as a bias voltage therefor, wherein said row driver is configured to output one of said high output level and said low output level when said memory row connected to said row driver is active; and a control unit coupled to said pull-up circuit and configured to supply a test mode signal as an input thereto, wherein said pull-up circuit is configured to provide said low output level as said bias voltage to said row driver in response to said test mode signal input, and wherein said control unit is configured to selectively generate said test mode signal; and a detection circuit responsive to a voltage level of an active row.

26. The system of claim 25, wherein said pull-up circuit in said memory device includes: a first circuit element configured to provide said high output level when activated; and a second circuit element connected to said first circuit element and configured to provide said low output level when said first circuit element is deactivated, and wherein said test mode signal is configured to deactivate said first circuit element.

27. A method of biasing a wordline driver, comprising:

operating a pull-up circuit to selectively connect an output bus to a predetermined voltage through one of a low strength current path and a high strength current path for producing a low level of output and a high level of output, respectively, said low level of output for limiting the current in said pull-up circuit; and applying said low level of output as a bias voltage to said wordline driver.

28. A method of biasing a wordline driver, comprising:

operating a gate induced drain leakage (GIDL) reduction circuit to selectively connect an output bus to a predetermined voltage through one of a low strength current path and a high strength current path to generate a lower one of two output levels;

applying said lower output level as a bias voltage to said wordline driver; and outputting said lower output level from said wordline driver when a wordline associated with said wordline driver is active.

29. A method of biasing a wordline driver, comprising:

operating a pull-up circuit to selectively connect an output bus to a predetermined voltage through one of a low strength current path and a high strength current path for producing a low supply strength output and a high supply strength output, respectively, and applying said low supply strength output as a bias voltage to said wordline driver.

30. A method of biasing a wordline driver, comprising:

operating a pull-up circuit to selectively connect an output bus to a predetermined voltage through one of a low strength current path and a high strength current path for generating one of a low voltage, low current drive output and a higher voltage, higher current drive output, respectively; and applying said low voltage, low current drive output as a bias voltage to said wordline driver.

31. A method of biasing a wordline driver, comprising:

providing a pull-up circuit capable of producing outputs of different current strengths by selectively connecting an output bus to a predetermined voltage through current paths of varying current strengths;

selectively generating a lower current strength output of said pull-up circuit; and applying said lower current strength output as a bias voltage to said wordline driver.

* * * * *